(12) United States Patent
Huang et al.

(10) Patent No.: US 6,337,279 B1
(45) Date of Patent: *Jan. 8, 2002

(54) METHOD OF FABRICATING A SHALLOW TRENCH ISOLATION

(75) Inventors: Chao-Yuan Huang; Juan-Yuan Wu, both of Hsinchu; Water Lur, Taipei, all of (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 12 days.

(21) Appl. No.: 09/215,061

(22) Filed: Dec. 17, 1998

(51) Int. Cl.$^7$ ............................................. H01L 21/302
(52) U.S. Cl. ........................ 438/692; 438/700; 438/745
(58) Field of Search .................................. 438/692, 700, 438/424, 426, 437, 745

(56) References Cited

U.S. PATENT DOCUMENTS

| | | | | |
|---|---|---|---|---|
| 5,316,965 A | * | 5/1994 | Philipossian et al. | 438/424 |
| 5,786,262 A | * | 7/1998 | Jang et al. | 438/424 |
| 5,801,082 A | * | 9/1998 | Tseng | 438/424 |
| 5,837,612 A | * | 11/1998 | Ajuria et al. | 438/697 |

* cited by examiner

Primary Examiner—Benjamin L. Utech
Assistant Examiner—Lynette T. Umez-Eronini
(74) Attorney, Agent, or Firm—Thomas, Kayden, Horstemeyer & Risley

(57) ABSTRACT

A method of fabricating a shallow trench isolation in semiconductor substrate comprises a densification process after performing chemical-mechanical polishing on an isolation plug. Thus, the isolation plug can prevent micro-scratches from forming deep scratches. Therefore, shorts arising from the micro-scratches do not happen.

1 Claim, 7 Drawing Sheets

METHOD OF FABRICATING A SHALLOW TRENCH ISOLATION

BACKGROUND OF THE INVENTION

1. Field of the Invention

The present invention relates to a semiconductor fabricating method. More particularly, the present invention relates to a method of forming an isolation region on a substrate of semiconductor device.

2. Description of the Related Art

An isolation region is formed in an integrated circuit for the purpose of separating neighboring device regions of a substrate and preventing the carriers from penetrating through the substrate to neighboring devices. In a dynamic random access memory (DRAM) device, for example, the field effect transistors (FETs) are isolated from each other by isolation regions in order to prevent current leakage among the FETs. Conventionally, local oxidation of silicon (LOCOS) technique is widely utilized in semiconductor industry to provide isolation regions among the various devices in the substrate. Since the LOCOS technique has been used for some time, it is one of the most reliable and low cost methods for fabricating device isolation regions. However, there are still some drawbacks of the LOCOS. The drawbacks include internal stress generation and bird's beak encroachment. For a highly integrated circuit, the problem of the bird's beak encroachment by the isolation regions is especially difficult to avoid, thus isolation regions cannot effectively isolate devices.

Shallow trench isolation (STI) technique is also a common conventional method of forming isolation regions. Shallow trench isolation is formed by first anisotropically etching to form a trench in the substrate, and then depositing oxide in the trench to form an isolation region having its top surface level with the substrate surface.

FIGS. 1A through 1D are schematic, cross-sectional views showing a conventional method of fabricating a shallow trench isolation.

In FIG. 1A, a pad oxide layer 102 is formed on a substrate 100. A silicon nitride layer 104 is formed on the pad oxide layer 102 by using chemical vapor deposition. A patterned photoresist layer 106 is formed on the silicon nitride layer 104.

In FIG. 1B, the patterned photoresist layer 106 is used as a mask. The silicon nitride 104, the pad oxide layer 102, and the substrate 100 are etched by a conventional photolithography process. A trench 108 is formed in the substrate 100. The patterned photoresist layer 106 is removed.

In FIG. 1C, a thermal oxidation is performed. A liner oxide layer 110 is formed on the sidewall of the trench 108 and conformal to the trench 108. An oxide layer 112 is formed over the substrate 100 to fill the trench 108 by using atmospheric pressure chemical vapor deposition.

In FIG. 1D, a densification process is performed to densify the oxide layer 112 at a temperature of about 1000° C. for about 10 minutes to 30 minutes to turn the oxide layer 112 into a compact layer. The silicon nitride layer 104 is used as an etching stop layer. A portion of the oxide layer 112 on the silicon nitride layer 104 is removed by chemical-mechanical polishing (CMP). An oxide plug 112a is formed in the trench 108. However, slurry used during the CMP step easily scratches the oxide layer 112. Therefore, micro-scratches 114 easily occur in the surface of oxide plug 112a during performing chemical-mechanical polishing.

In FIG. 1E, a hot phosphoric acid ($H_3PO_4$) is used to remove the silicon nitride layer 104. Then, a hydrofluoric (HF) dip step is performed to remove the pad oxide layer 102. Therefore, a oxide plug 112b is formed in the substrate 100.

In the conventional process, the micro-scratches 114 generated during the CMP step become deep scratches 116 after the HF dip step. According to the experimental data, the scratches 116 may even have a depth of about 0.1 m. Polysilicon layers (not shown) easily fill the scratches 116 in the following process of forming metal oxide semiconductor (MOS) transistors. The polysilicon layer filling the scratches 116 are difficult to remove in the step of patterning the polysilicon layers. The remaining polysilicon layers thus easily connect with neighboring active regions beside shallow trench isolation and give rise to device shorts.

SUMMARY OF THE INVENTION

It is therefore an objective of the present invention to provide a method of forming a shallow trench isolation that prevents device shorts due to micro-scratches from happening.

To achieve these and other advantages and in accordance with the purpose of the present invention, as embodied and broadly described herein, this invention provides a method of fabricating a shallow trench isolation. The method performs a densification process after performing chemical-mechanical polishing on an isolation plug. The isolation plug becomes compact after the densification process. Thus, the isolation plug can prevent micro-scratches from forming deep scratches so that shorts due to the micro-scratches do not happen.

The invention of fabricating a shallow trench isolation includes the following steps. A pad oxide layer is formed on a substrate. A mask layer and a photoresist layer are formed in sequence over the substrate. A photolithography process is performed. The photoresist layer is used as an etching mask. The mask layer, the pad oxide layer, and the substrate are patterned. A trench is formed in the substrate. A liner oxide layer is formed on the substrate exposed by the trench by thermal oxidation. An isolation layer fills in the trench. A densification process is performed on the isolation layer. The isolation layer on the pad layer is removed by chemical-mechanical polishing. Then, a post-CMP densification process is performed. Sequentially, the mask layer and the pad oxide layer are removed by wet etching to form an isolation plug.

It is to be understood that both the foregoing general description and the following detailed description are exemplary, and are intended to provide further explanation of the present invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
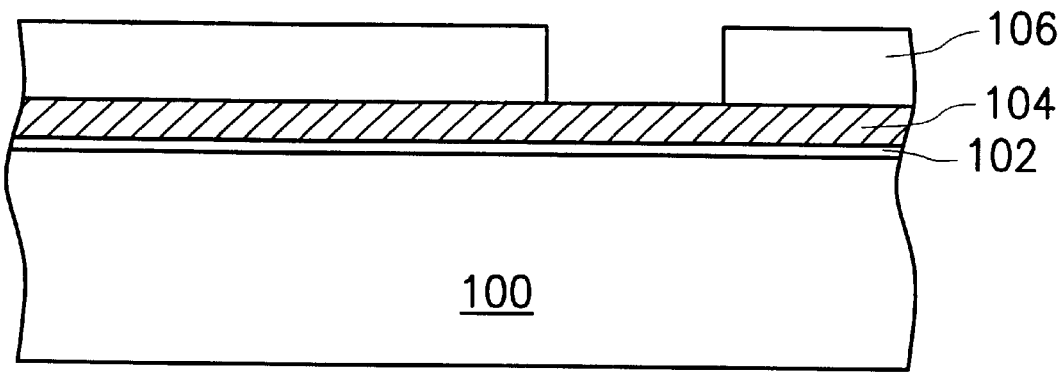
FIGS. 1A through 1E are schematic, cross-sectional views showing a conventional method of fabricating a shallow trench isolation.
Figure 1B:
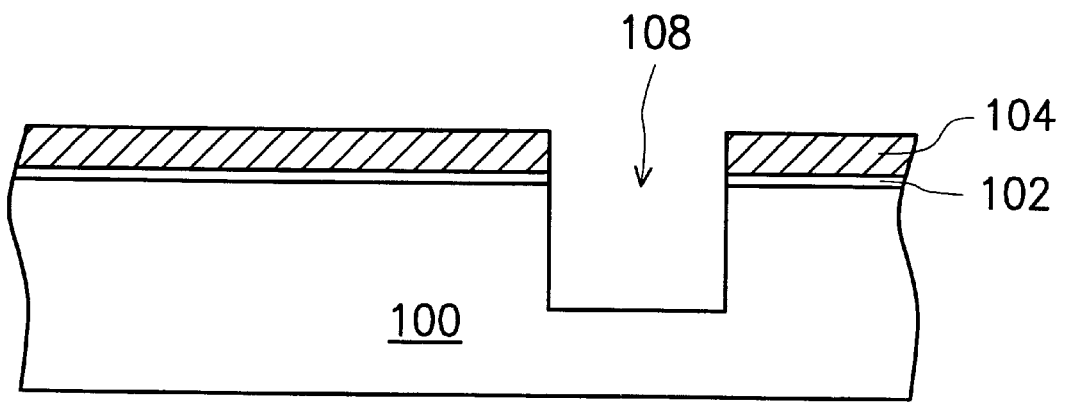
Figure 1C:
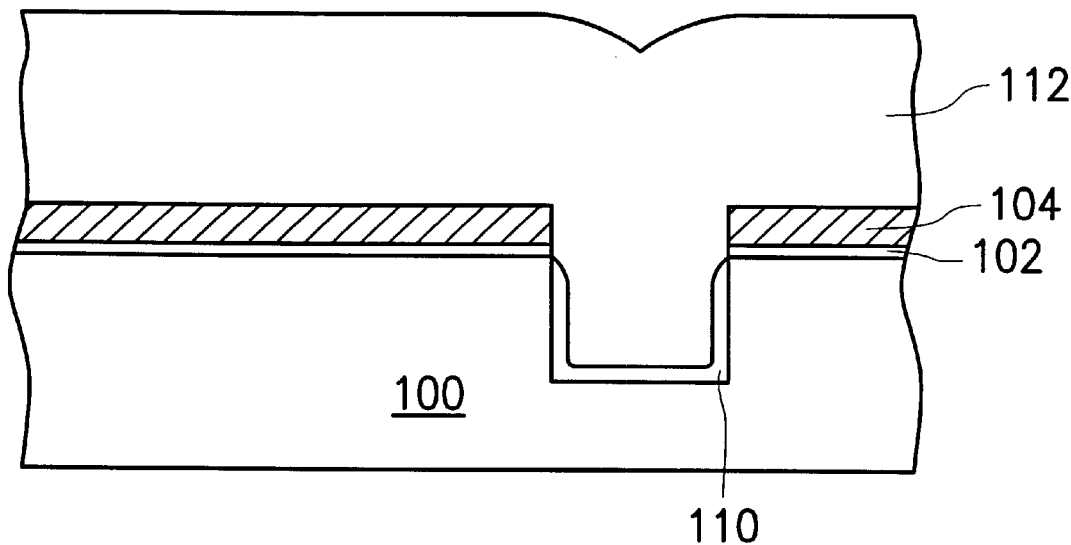
Figure 1D:
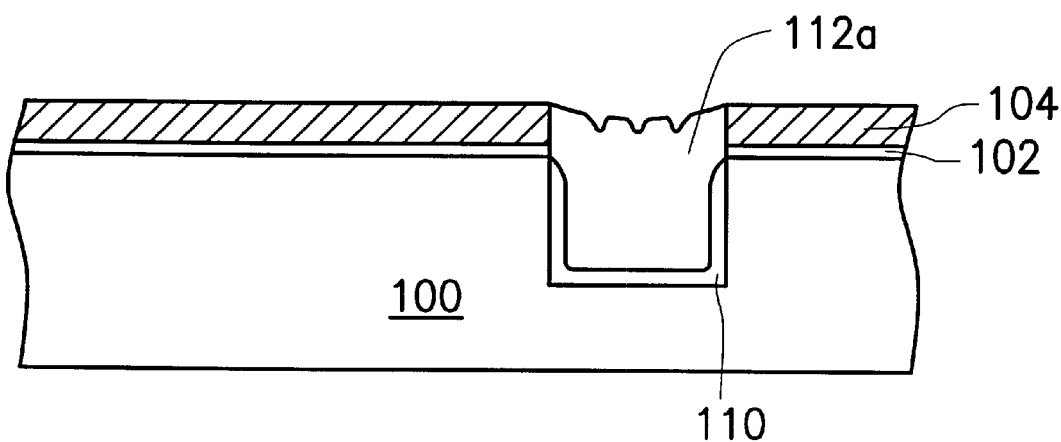
Figure 1E:
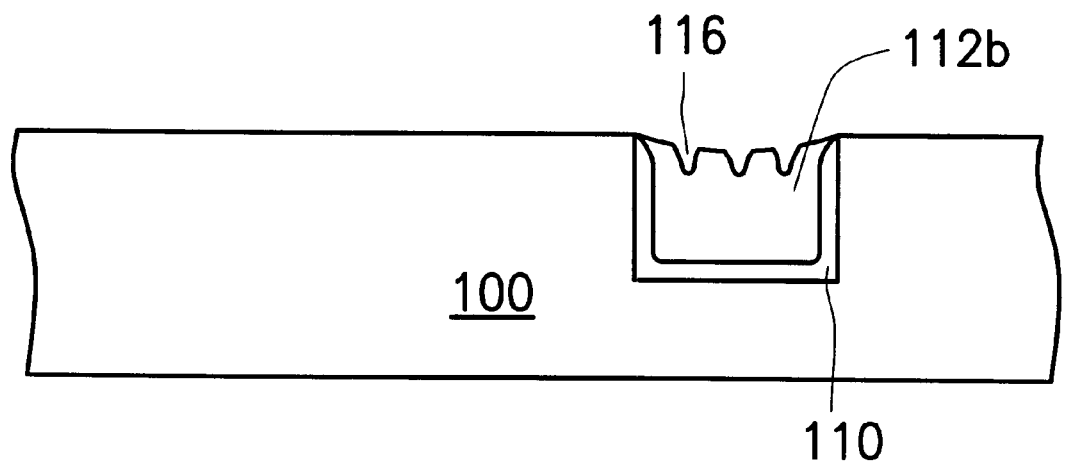

Reference will now be made in detail to the present preferred embodiments of the present invention, examples of which are illustrated in the accompanying drawings. Wherever possible, the same reference numbers are used in the drawings and the description to refer to the same or like parts.

FIGS. 2A through 2E shows a method of fabricating a shallow trench isolation according to one preferred embodiment of the present invention.

Figure 2A:
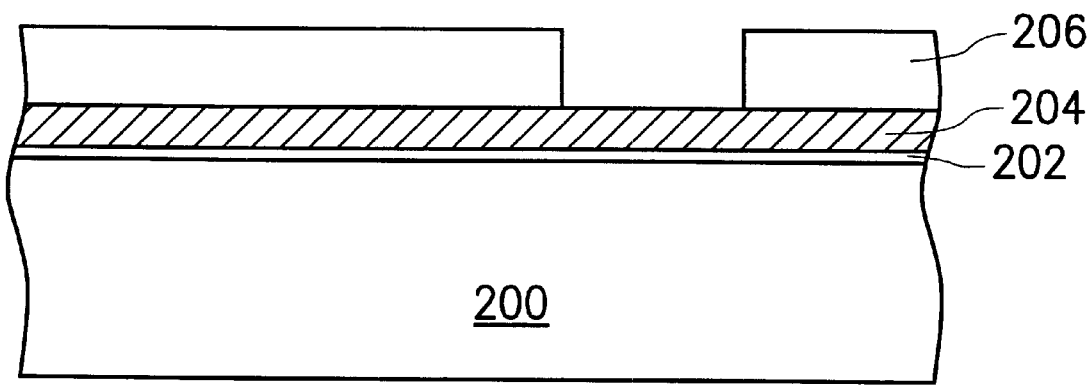
FIGS. 2A through 2E are schematic, cross-sectional views showing a method of fabricating a shallow trench isolation according to one preferred embodiment of the invention.
Figure 2B:
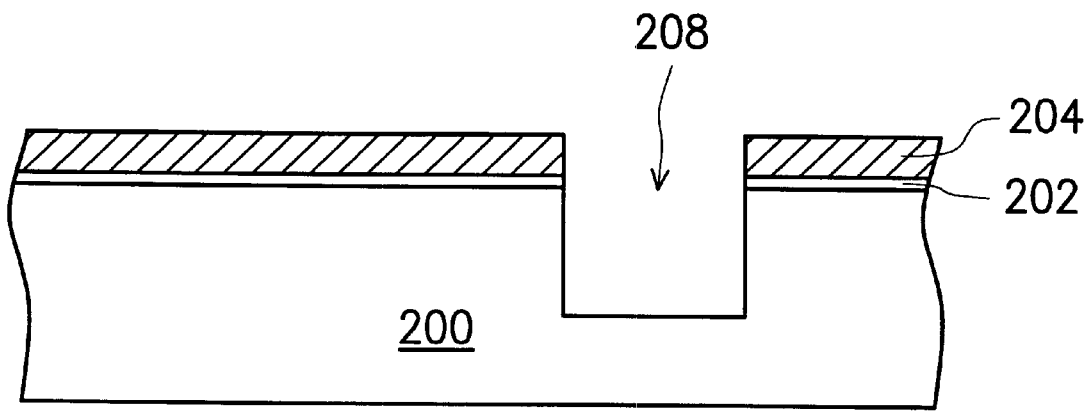

In FIG. 2A, a pad oxide layer 202 is formed on a semiconductor substrate 200. The pad oxide layer 202, such as a silicon oxide layer, is used to protect the substrate 200. The pad oxide layer 202 having a thickness of about 50 Å to 500 Å can be formed by thermal oxidation. A mask layer 204 is formed on the pad oxide layer 202. The mask layer 204 can be formed by chemical vapor deposition. The material of the mask layer 204 includes silicon nitride. A patterned photoresist layer 206 is formed on the mask layer 204. An etching step is performed to etch the mask layer 204, the pad oxide layer 202, and the substrate 200 to form a trench 208 in the substrate 200. The etching step includes dry etching and wet etching. In general, an anisotropic etching step is performed to form the trench 208 in the substrate 200 having a depth of about 2000 Å to 5000 Å. The photoresist layer 206 is removed.

Figure 2C:
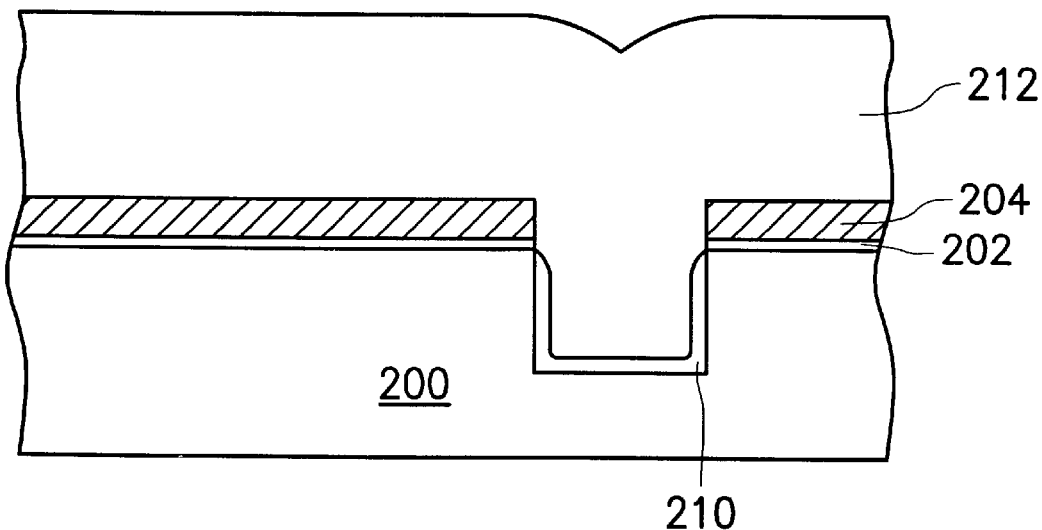

In FIG. 2C, a liner oxide layer 210 is formed on the substrate 200 exposed by the trench 208. The liner oxide layer 210 can be formed by thermal oxidation, for example. The liner oxide layer 210 can be a silicon oxide layer having a thickness of about 300 Å to 500 Å, for example. An isolation layer 212 is formed over the substrate 200 to fill the trench 208. The material of the isolation layer 212 includes oxide and silicon oxide. The isolation layer 212 can be formed by atmospheric pressure chemical vapor deposition (APCVD), sub-atmospheric pressure chemical vapor deposition (SACVD), high-density plasma chemical vapor deposition (HDP CVD), or low-pressure chemical vapor deposition (LPCVD), for example.

Figure 2D:
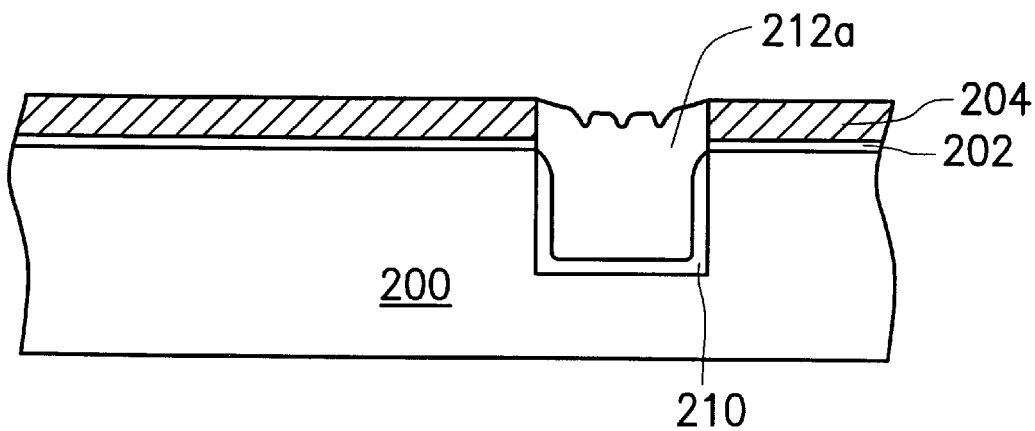

In FIG. 2D, a densification process is performed at a temperature of about 900° C. to 1100° C. for about 10 minutes to 30 minutes. The mask layer 204 is used as an etching stop layer. The isolation layer 212 on the mask layer 204 is removed by chemical-mechanical polishing. An isolation plug 212a is formed in the trench 208.

Figure 2E:
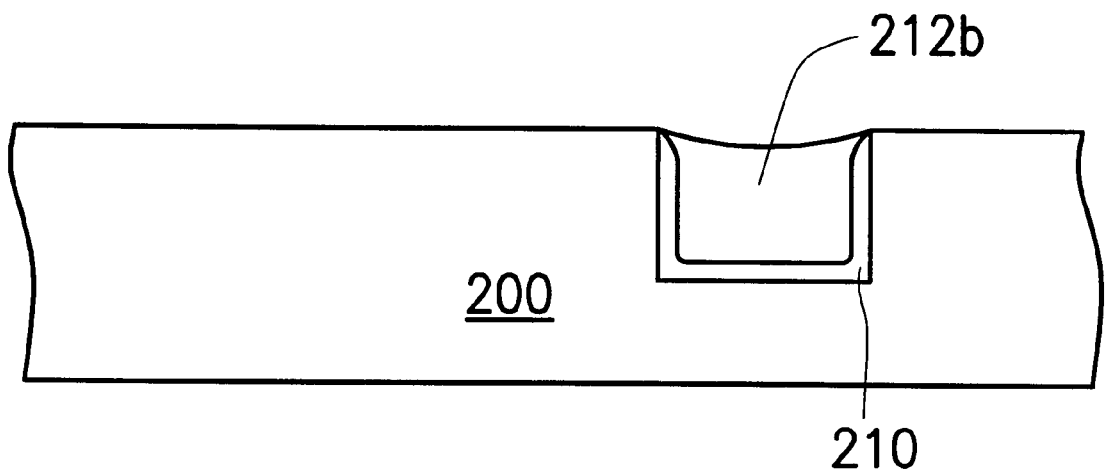

A post-densification is performed, for example in thermal cycle of furnace or rapid thermal process, at the temperature of 850° C. to 1150° C. And then, as shown in FIG. 2E, the mask layer 204 is removed by wet etching, in which a hot $H_3PO_4$ solution is used, for example. The pad oxide layer 202 and a portion of the post-densified isolation layer 212a are removed by HF dipping. In the present method, since a post-CMP densification step is performed, the etching rate of the isolation plug 212a by HF dipping decreases. As the etching rate decreases, the number of micro-scratches decreases. Scratches with deep depth are not formed.

Figure 3:
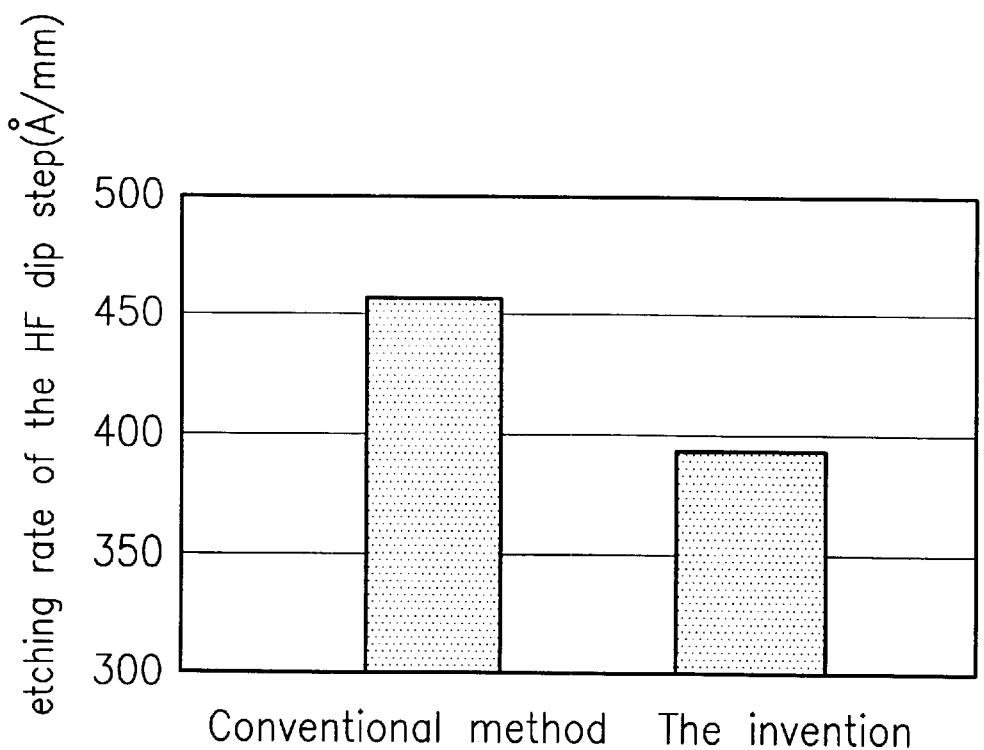
FIG. 3 is a diagram showing comparison of etching rates between the conventional method and the invention.

FIG. 3 is a diagram comparing etching rates of the conventional method and the present method of this invention. In FIG. 3, the wet etching rate of an isolation plug according to the conventional method is about 460 Å/min during the HF dip step. The wet etching rate of an isolation layer according to the present invention is about 385 Å/min after the HF dip step. The isolation plug is densified again by post-CMP densification in the present invention so that the etching rate of the isolation layer decreases.

Figure 4:
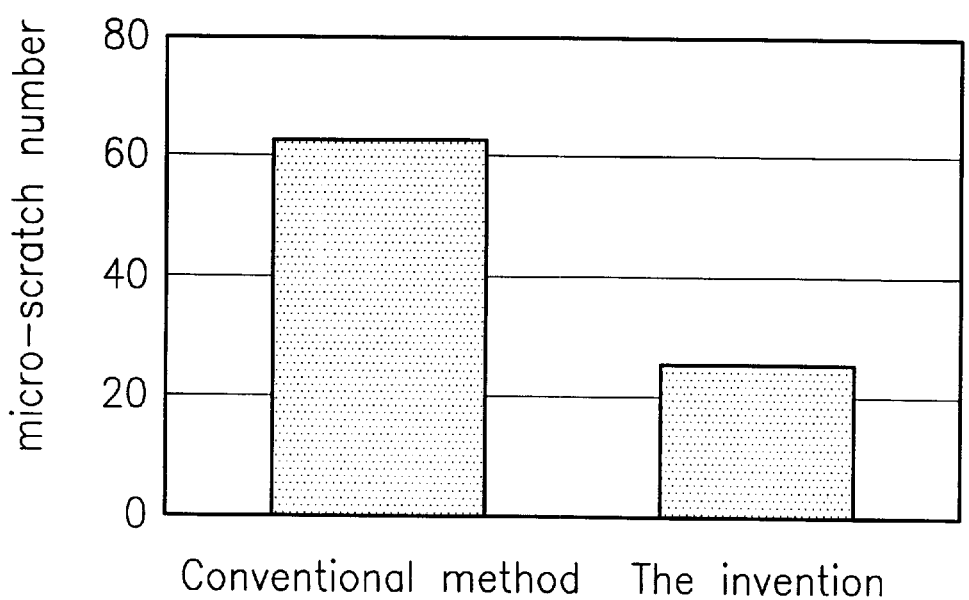
FIG. 4 is a diagram showing comparison of scratch numbers between the conventional method and the invention.

FIG. 4 is a diagram comparing scratch numbers of the conventional method and the invention. In FIG. 4, the micro-scratch number of an isolation layer according to the conventional method is about 60 after HF dipping. In the present invention, the micro-scratch number decreases to 23 after HF dipping. The present invention performs a post-CMP densification process to make the isolation plug more compact so that the etching rate of the isolation plug decreases. As the etching rate of the isolation plug decreases, the number of micro-scratch decreases.

In summary, the advantages of the invention include the following:

1. The isolation plug is densified again by post-CMP densification in the present invention to be reinforced so that the etching rate of the isolation layer decreases.
2. The present invention performs a post-CMP densification process to make the isolation plug compact so that the etching rate of the isolation plug decreases. As the etching rate of the isolation plug decreases, the number of micro-scratches decreases.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a shallow trench isolation without forming micro-scratches in a surface thereof, comprising the steps of:

providing a substrate having a mask layer formed thereon;

patterning the mask layer and the substrate to form a trench in the substrate;

forming a liner oxide layer on a portion of the substrate exposed by the trench;

forming an isolation layer over the substrate to fill the trench;

performing a densification process on the isolation layer;

performing a chemical-mechanical polishing (CMP) is performed to remove a portion of the isolation layer until exposing the mask layer to leave a remaining isolation layer;

performing a post-CMP densification process on the remaining isolation layer after performing the CMP; and removing the mask layer, the pad oxide layer, and a portion of the remaining isolation layer to form an isolation plug in the trench.

* * * * *